United States Patent
Fontana et al.

(10) Patent No.: US 9,841,341 B2
(45) Date of Patent: Dec. 12, 2017

(54) PACKAGE FOR SEMICONDUCTOR DEVICES SENSITIVE TO MECHANICAL AND THERMO-MECHANICAL STRESSES, SUCH AS MEMS PRESSURE SENSORS

(71) Applicants: STMICROELECTRONICS S.R.L., Agrate Brianza (IT); STMICROELECTRONICS, INC., Calamba (PH)

(72) Inventors: Fulvio Vittorio Fontana, Monza (IT); Jefferson Talledo, Calamba (PH)

(73) Assignees: STMICROELECTRONICS S.R.L., Agrate Brianza (IT); STMICROELECTRONICS, INC., Calamba (PH)

( * ) Notice: Subject to any disclaimer, the term of this patent is extended or adjusted under 35 U.S.C. 154(b) by 0 days.

(21) Appl. No.: 14/861,648

(22) Filed: Sep. 22, 2015

(65) Prior Publication Data

US 2016/0146692 A1  May 26, 2016

(30) Foreign Application Priority Data

Nov. 26, 2014 (IT) .............. TO2014A0977

(51) Int. Cl.
 *H01L 21/50* (2006.01)
 *H01L 23/498* (2006.01)
 (Continued)

(52) U.S. Cl.
 CPC .......... *G01L 19/148* (2013.01); *B81B 7/0045* (2013.01); *B81C 1/00325* (2013.01);
 (Continued)

(58) Field of Classification Search
 CPC .......... H01L 2924/00; H01L 23/49575; H01L 2224/73221; H01L 23/00; H01L 23/4985; H01L 21/50; H01L 23/057; G01L 19/148
 (Continued)

(56) References Cited

U.S. PATENT DOCUMENTS 5,173,766 A  12/1992 Long et al.
6,309,915 B1  10/2001 Distefano
(Continued)

FOREIGN PATENT DOCUMENTS

| CN | 103824835 A | 5/2014 |
| CN | 205257993 U | 5/2016 |
| FR | 2 906 236 A3 | 3/2008 |

*Primary Examiner* — Moazzam Hossain
*Assistant Examiner* — Omar Mojaddedi
(74) *Attorney, Agent, or Firm* — Seed Intellectual Property Law Group LLP

(57) ABSTRACT

A surface mounting device has one body of semiconductor material such as an ASIC, and a package surrounding the body. The package has a base region carrying the body, a cap and contact terminals. The base region has a Young's modulus lower than 5 MPa. For forming the device, the body is attached to a supporting frame including contact terminals and a die pad, separated by cavities; bonding wires are soldered to the body and to the contact terminals; an elastic material is molded so as to surround at least in part lateral sides of the body, fill the cavities of the supporting frame and cover the ends of the bonding wires on the contact terminals; and a cap is fixed to the base region. The die pad is then etched away.

23 Claims, 5 Drawing Sheets

(51) Int. Cl.
*G01L 19/14* (2006.01)
*B81B 7/00* (2006.01)
*B81C 1/00* (2006.01)
*H01L 23/057* (2006.01)
*H01L 23/495* (2006.01)

(52) U.S. Cl.
CPC ............ *H01L 21/50* (2013.01); *H01L 23/057* (2013.01); *H01L 23/49575* (2013.01); *H01L 23/49861* (2013.01); *H01L 2224/48091* (2013.01); *H01L 2224/73265* (2013.01); *H01L 2224/8592* (2013.01)

(58) Field of Classification Search
USPC .......................... 257/420, 669, 686; 438/612
See application file for complete search history.

(56) References Cited

U.S. PATENT DOCUMENTS

| | | |
|---|---|---|
| 6,460,245 B1 | 10/2002 | DiStefano |
| 8,816,492 B1* | 8/2014 | Minervini ........... B81C 1/00261 257/701 |
| 2005/0046021 A1 | 3/2005 | Hosokawa |
| 2005/0056870 A1* | 3/2005 | Karpman ............. B81B 7/0048 257/222 |
| 2007/0290364 A1* | 12/2007 | Gupta .................... B81B 7/007 257/777 |
| 2014/0091443 A1 | 4/2014 | Duca et al. |
| 2014/0210019 A1* | 7/2014 | Nasiri .................. B81C 1/0023 257/415 |

* cited by examiner

PACKAGE FOR SEMICONDUCTOR DEVICES SENSITIVE TO MECHANICAL AND THERMO-MECHANICAL STRESSES, SUCH AS MEMS PRESSURE SENSORS

BACKGROUND

Technical Field

The present disclosure relates to a package for semiconductor devices sensitive to mechanical and thermo-mechanical stresses, such as MEMS pressure sensors.

Description of the Related Art

As is known, semiconductor devices, such as integrated circuits and MEMS devices, are generally encapsulated in packages for their protection and handling. Hereinafter, reference is made to packages that allow surface mounting.

Presently, the most used type of surface mounted packages for MEMS sensors is the so-called LGA (LAND grid array) package, which has a square or rectangular grid of contacts on the underside of the package.

However, the standard LGA package for MEMS pressure sensors is not compliant with automotive requirements where a solder inspection of the printed circuit board is provided for. Therefore, so-called quad-flat no-leads-single row (QFN-Sr), also called micro leadframe (MLF) and SON (small-outline no leads), packages are used for automotive applications, that is packages that allow surface mounting, and have one peripheral row of terminals on the bottom surface.

In standard QFN technology, the leadframe is post-molded, and the empty spaces are filled using resins having a coefficient of thermal expansion (CTE) close to that of the metal leadframe, in order to avoid delamination. However, these resins have high elastic modulus and the package is quite stiff. As a consequence, mechanical and thermo-mechanical stresses are transmitted to the pressure sensor after soldering the package on PCB card, resulting in offsets and drifts. The reading of the sensor is thus negatively affected by noise due to stresses generated on the vehicle and transmitted to the sensor by the stiff package; or by stresses generated during the surface mounting process, due to solder connections cooling; by stresses generated during mounting on the vehicle, due to mechanical tolerance mismatch, or by stresses generated during the device life, due to cockpit temperature changes.

In different packages, so called premolded QFN, it is possible to have a leadframe with a pre-molded plastic cavity. This solution solves the problem of avoiding stress transmission by the resin of the package but not by stresses transmitted by the copper leadframe.

Therefore, standard QFN packages pre- or post-molded cannot be used for MEMS pressure sensors intended for automotive application.

On the other hand, the use of low-modulus substrate LGA is not possible due to the risk of substrate warpage and poor ultrasonic transmission during ultrasonic wire bonding.

BRIEF SUMMARY

One or more embodiments of the disclosure may provide a package for semiconductor devices of the QFN type that overcomes one or more of the drawbacks of prior art solutions.

In one embodiment, instead of using a pre-molded rigid leadframe, the package has a base region of an elastic material, with a Young's modulus lower than 5 MPa, that is molded on the leadframe after attaching the die. In an embodiment, the die attach pad of the standard leadframe is removed, so to increase elasticity of the package. A damping structure may be provided, to protect the bonding wires and the dice in case of high impact forces, such as those caused from a fall.

BRIEF DESCRIPTION OF THE SEVERAL VIEWS OF THE DRAWINGS

For the understanding of the present disclosure, preferred embodiments are now described, purely as a non-limitative example, with reference to the enclosed drawings, wherein.

DETAILED DESCRIPTION

Figure 1:
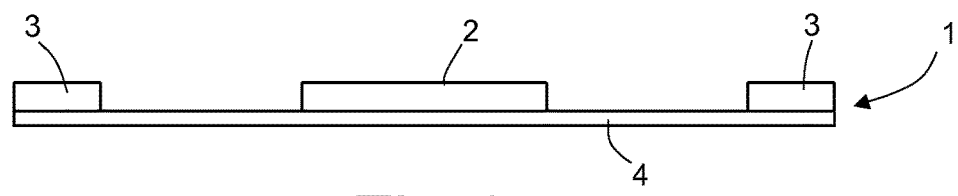
FIGS. 1-6 are cross-sections showing subsequent packaging steps according to an embodiment of the instant packaged device.

FIG. 1 shows a supporting frame 1 for QFN (quad-flat no-leads) packages including a die pad 2 and a plurality of terminals 3, attached onto an adhesive tape 4. The supporting frame 1 is a leadframe and may be of any suitable material, such as copper, aluminum and the like. In this embodiment, the die pad 2 is not plated on the bottom, while the terminals 3 are plated on the bottom and lateral sides. E.g., the terminals 3 may be Ni, Pd, Au or the like plated, in a per se known manner for QFN packages. The adhesive tape 4 may be a thermoplastic, standard one, attached to the backside of the supporting frame 1.

Figure 2:
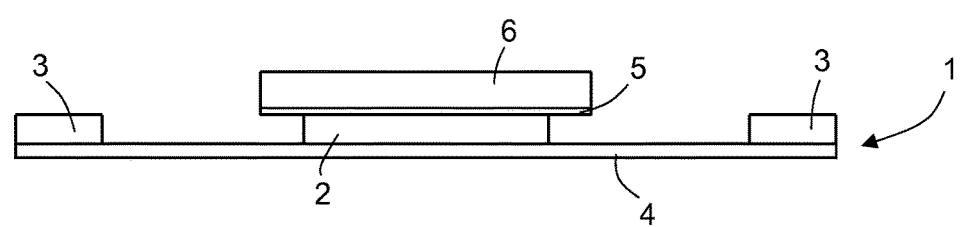

As shown in FIG. 2, a first adhesive film 5 is attached to a front surface of the die pad 2 and a first die 6 is placed on the first adhesive film 5. The first die 6 is larger than the die pad 2. The first adhesive film 5 may be a DAF (Die Attach Film), currently used in semiconductor industry; for example, it may be a known epoxy resin, laminated on the supporting frame 1 such as LE 5003 produced by Nitto Denko Corporation. The first adhesive film 5 may be shaped, e.g., by standard cutting or singulation together with the first die 6, before they are placed onto the leadframe 1, with the first adhesive film 5 attached on the bottom surface of the wafer including the first die 6. The first die 6 may be an integrated circuit, such as an ASIC (Application Specific Integrated Circuit), including signal processing circuits.

Figure 3:
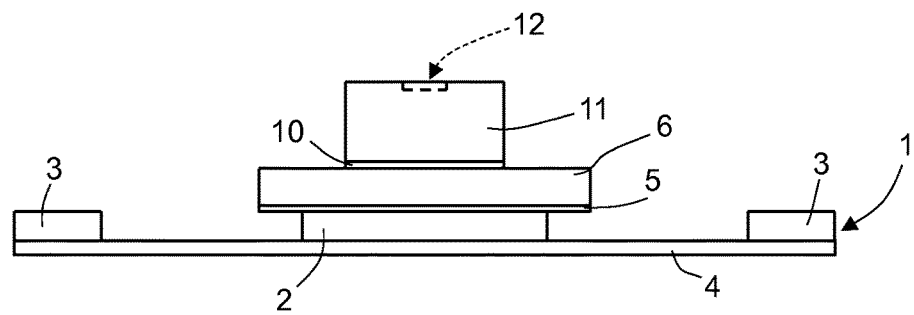

As shown in FIG. 3, a second die 11 having attached on the bottom a second adhesive film 10 is placed on top of the first die 6. The second adhesive film 10 may be a DAF, analogous to the first adhesive film 5, placed and shaped in the same way. The second die 11 may be a MEMS component such as a pressure sensor, having a diaphragm 12, shown schematically only in FIG. 3.

The first and second adhesive films 5, 10 are cured in oven in a nitrogen gas atmosphere, e.g., at 160-180° C.

Figure 4:
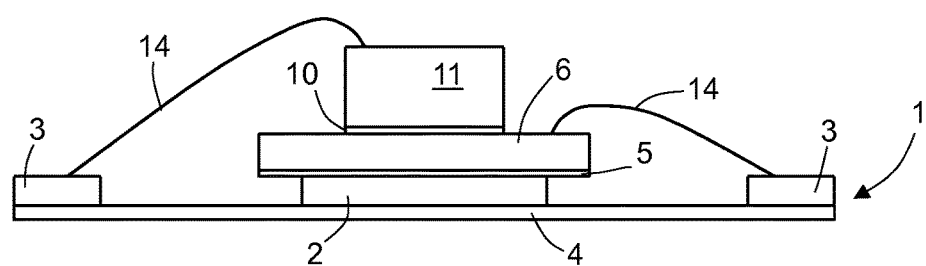

Bonding wires 14 are attached between the terminals 3 on one end, and to the first die 6 or the second die 11 on the other end, FIG. 4. The bonding wires 14 may be standard copper ones, attached using known standard techniques suitable for the intended application.

Figure 5:
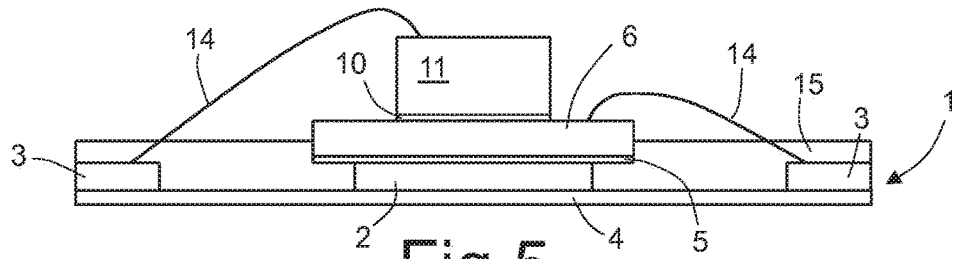

As shown in FIG. 5, a base region 15 is formed. The base region 15 is an elastic material, e.g., a silicone adhesive having a quite low Young's modulus E<5 MPa, for example lower than 2 MPa, which is applied in semi-fluid state, for example dispensed, so as to fill cavities of the supporting frame 1 between the die pad 2 and the terminals 3. In the alternative, an elastomeric, non-silicone material having the indicated low Young's modulus and good adhesion to copper may be used. For example, DA 6503 manufactured by Down Corning Corporation may be used. The base region 15 has a higher thickness than the supporting frame 1, so as to cover terminals, together with the ends of the bonding wires 14 attached to the terminals. In one embodiment, the base region 15 has a thickness that is substantially equal to or slightly higher than the thickness of the support frame 1, which includes the die pad 2 and the terminals 3. For instance, in one embodiment the base region 15 is the thickness of the leadframe 1, plus 0.02 mm. Since here the first die 6 is larger than the die pad 2 and thus covers the upper surface of the latter, the base region 15 does not extend on top of the die pad 2, but laterally surrounds the latter, together with at least the lower portion of the lateral surface of the first die 6.

Figure 6:
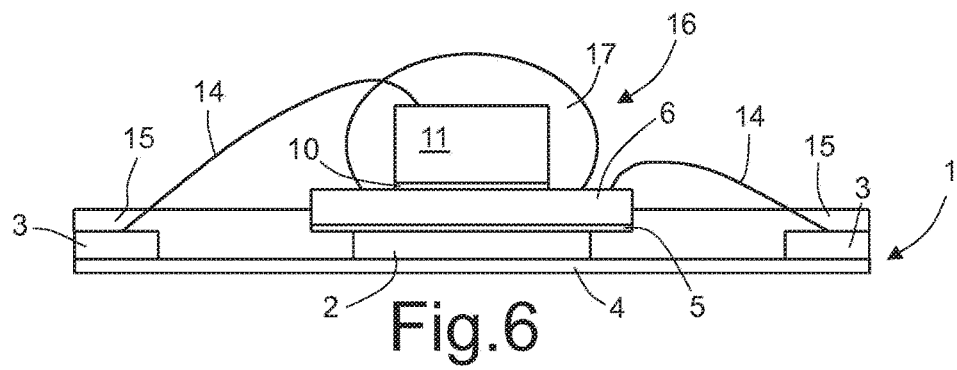
Figure 7:
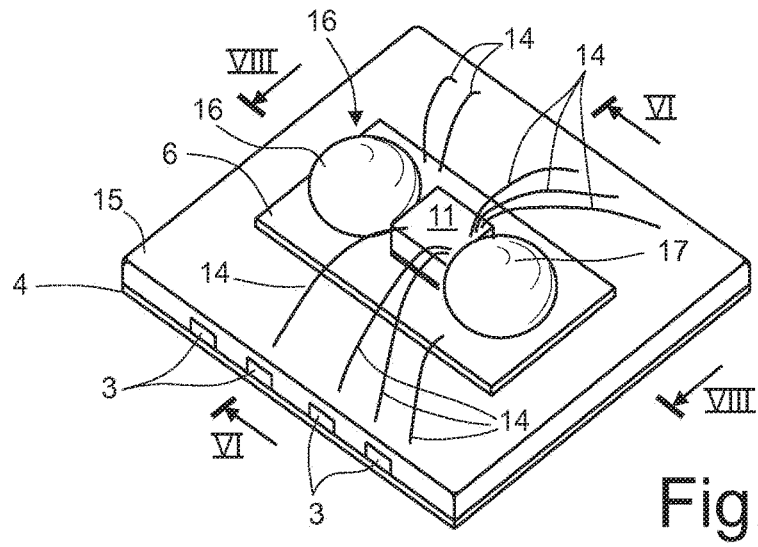
FIG. 7 shows the intermediate packaged device of FIG. 6 in a perspective view.
Figure 8:
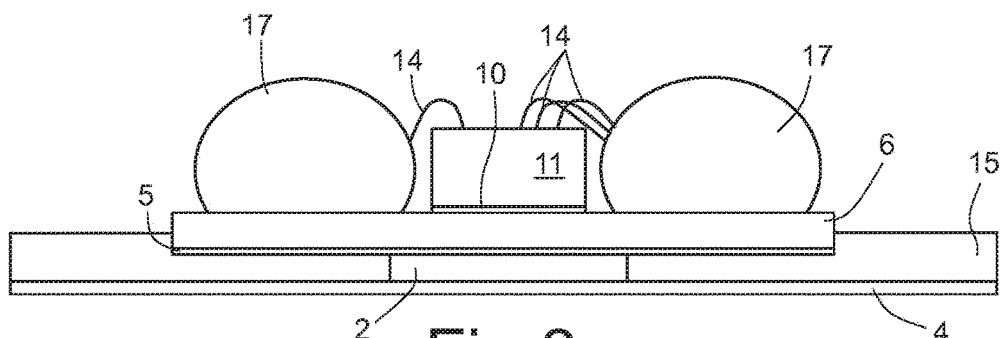
FIG. 8 is a cross-section taken along section plane VIII-VIII of FIG. 6.

According to FIGS. 6-8, a damping structure 16 is formed. In the illustrated embodiment, the damping structure 16 includes two bumps 17 formed on the front surface of the first die 6, laterally to the second die 11. For example, the damping structure 16 may be of the same silicone elastic material as the base region 15 and the bumps 17 may extend each on a respective different side of the second die 11. However, the bumps 17 may be formed in a different position, as discussed later on, or be of a different material, as long as they ensure the desired damping effect, as discussed below.

Figure 9:
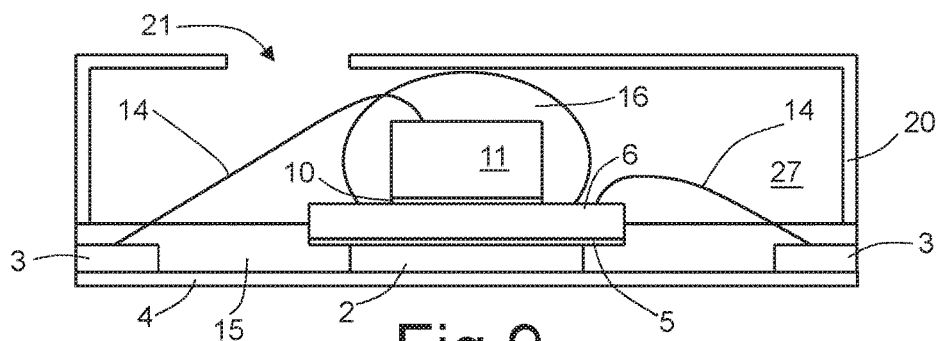
FIG. 9 is a cross-section showing a packaging step following the step of FIG. 6.
Figure 10:
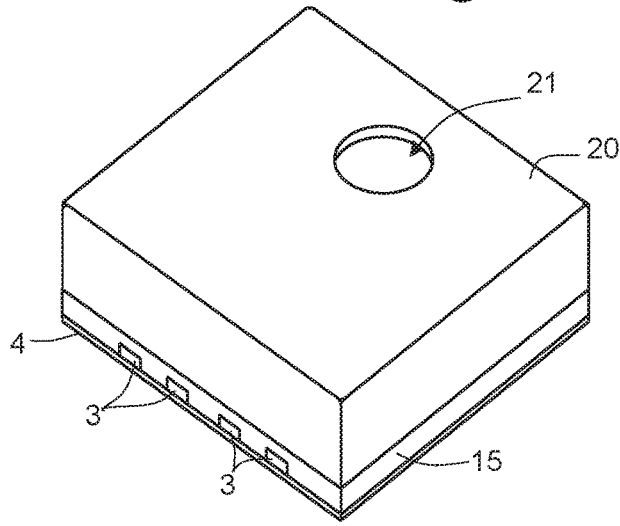
FIG. 10 shows the intermediate packaged device of FIG. 9 in a perspective view.

According to FIGS. 9 and 10, a cap 20 is attached to the base region 15, thus forming a packaged device 50 with an open cavity 27. The cap 20 may be an aluminum or a glass reinforced plastic one, with a hole 21 to allow fluidic connection of the inside to the outside of the cap 20, thereby exposing the second die 11 to the outside environment.

The base region 15 is cured in a static oven at a temperature of 150-170° C.

Figure 11:
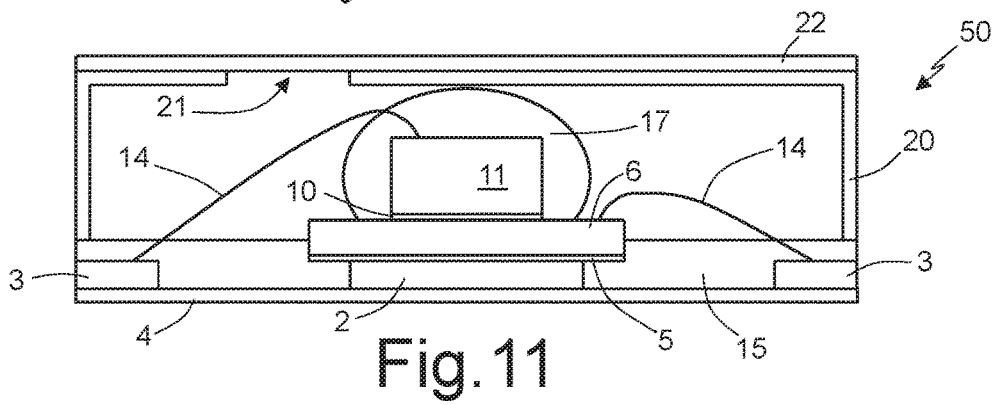
FIGS. 11-14 are cross-sections showing subsequent packaging steps following the step of FIG. 9.

According to FIG. 11, a protective tape 22 is applied on the upper surface of the cap 20, so as to cover the hole 21. For example, the protective tape 22 may be polyimide or Kapton® or any material resistant to an etching solution of the supporting frame 1, as discussed below.

Figure 12:
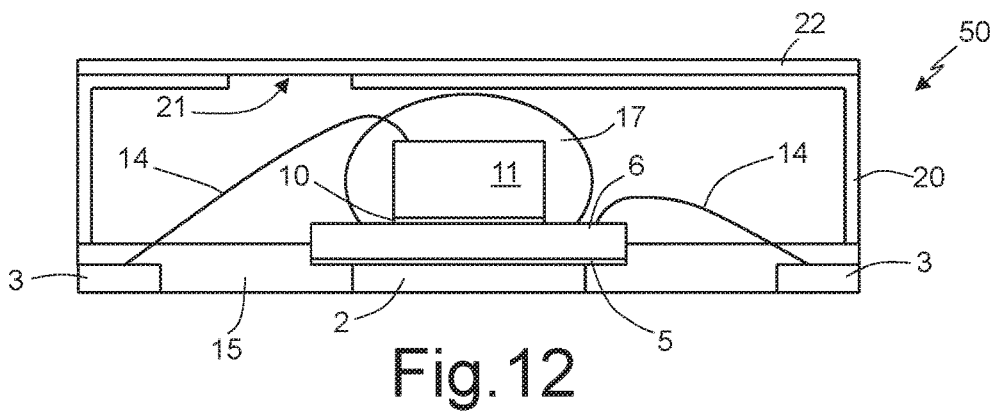

According to FIG. 12, the adhesive tape 4 is removed, e.g., peeled off from the back of the packaged device 50.

Figure 13:
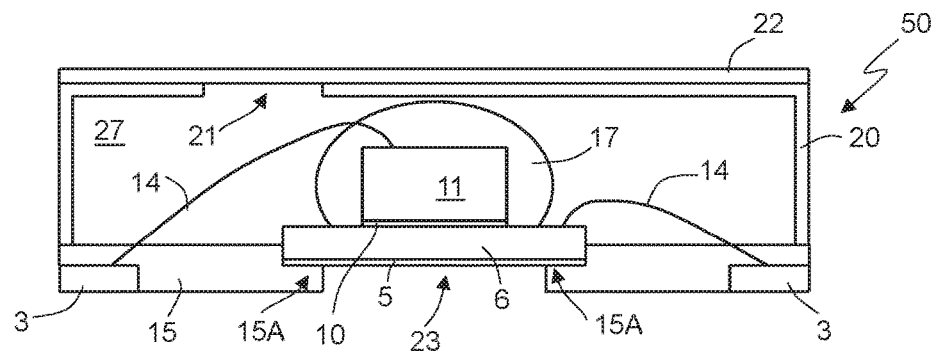

As shown in FIG. 13, the die pad 2 is etched, e.g., using a basic solution such as an ammonia solution. During etching, the terminals 3 are protected by being plated. Since the die pad 2 is smaller than the first adhesive film 5 and the first die 6, the base region 15 is attached to the peripheral lower portion of the first die 6, partially through the first adhesive film 5. In addition, as indicated above, the protective tape 22 prevents the etchant from entering the cap 20 and from coming into contact with the dice 6, 11. Then, the packaged device 50 is washed. Therefore, a package is obtained, formed by the cap 20 and the base region 15, wherein the base region 15 has a cavity 23 extending under the dice 6, 11 and laterally delimited by an internal annular portion 15A of the base region 15 that is glued to and supports the first die 6. The first die 6 is thus held only at the lower edge by the internal annular portion 15A of the base region 15, to which it is firmly glued, partially with the interposition of the first adhesive film 5. As a consequence, in this embodiment, the packaged device 50 has an elastic, low modulus base formed by base region 15, and no rigid metal pad region extends under the first die 6.

Figure 14:
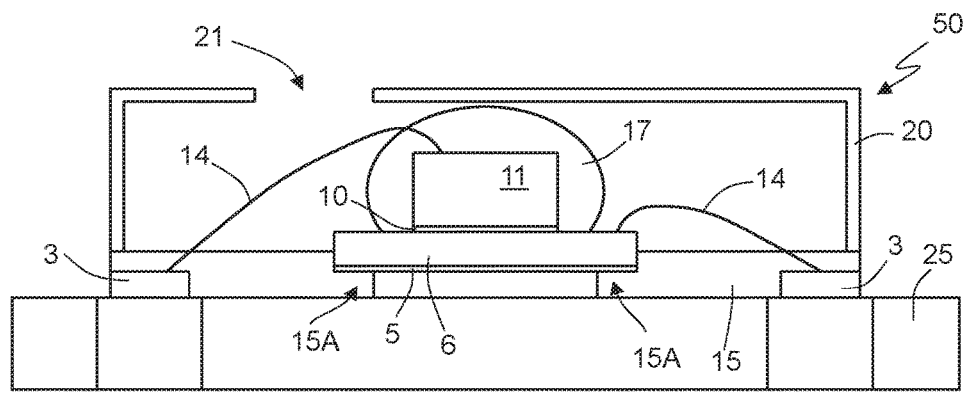

As shown in FIG. 14, the protective tape 22 is removed and the packaged device 50 is bonded to a support 25, such as a printed circuit board PCB, e.g., using a solder paste (not shown).

Tests carried out by the Applicant have shown that the low modulus base region 15 of the packaged device 50 is very good in relieving mechanical and thermo-mechanical stress generated during manufacturing, mounting and life of the device. In fact, the base region 15 reliably prevents stresses generated during soldering the packaged device 50 to the support 25 or during mounting the support 25 in place from being transferred to the second die 11. The same decoupling action is also ensured during operation of the packaged device 50, since the packaged device 50 is soldered on the support 25 (SMT—surface mounted technology card), for example in case of stresses due to temperature variations.

In addition, the base region 15 covers the ends of the bonding wires 14 welded on the terminals 3, thereby protecting them from moisture and mechanical stresses.

The base region 15 also forms an attachment structure for the cap 20, thereby ensuring a very good tightness of the packaged device 50.

The flexibility of the base region 15 allows the use of adhesive films 5, 10 of the DAF type, which are inherently more rigid than standard glues, but may be applied with a faster and simpler process, to the advantage of the packaging costs.

Figure 15:
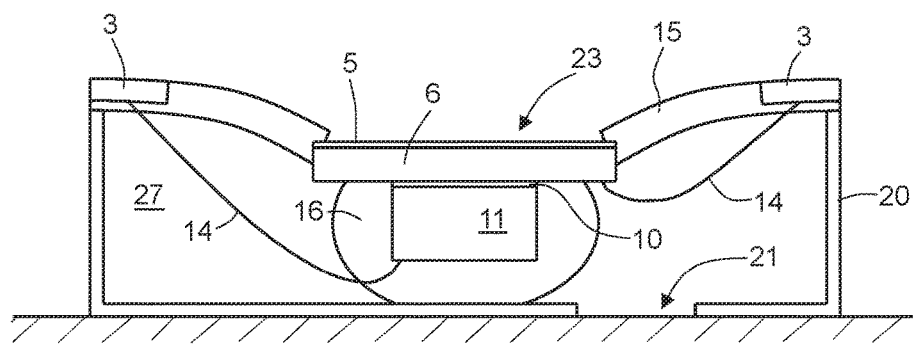
FIG. 15 is a simulation of the deformation of the instant packaged device in case of fall.

The damping structure 16 offers a good protection to the packaged device 50 also in case of fall. In fact, as shown in FIG. 15, due to the quite high deformability of the base region 15 and flexing into the open cavity 27 as shown in FIG. 15, the described packaged device 50 has a higher flexibility with respect to pre-molded packages and thus a higher tendency to deformation in case of impacts and falls. However, in this situation, the damping structure 16 hits the cap 20 first and limits the movements of the dice 6, 11. Excessive deformations of the base region 15 are also prevented by bumps 17. Thereby, the dice 6, 11 and the bonding wires 14 are not damaged. This is in particular important when the second die 11 is a MEMS pressure sensor having a suspended diaphragm 12 (FIG. 3). In particular, in tests carried out by the Applicant, it has been demonstrated that even in case of drop heights higher than 1 m against a rigid steel surface with the device 50 arranged upside down, the bumps 17 protect the dice 6, 11 and the packaged device 50 remains operative and perfectly functioning, thereby complying the present norms in the automotive field in AEC-Q100-REVG May 14, 2007. The packaged device 50 is thus reliably applicable in automotive field, for example to measure air flow (as a differential pressure device) in altimeter cockpits, or as an air flow measurement device based on differential pressure measurement, to set air conditioning flow in cockpits.

Finally, it is clear that numerous variations and modifications may be made to the described and illustrated device herein, all falling within the scope of the disclosure.

Figure 16:
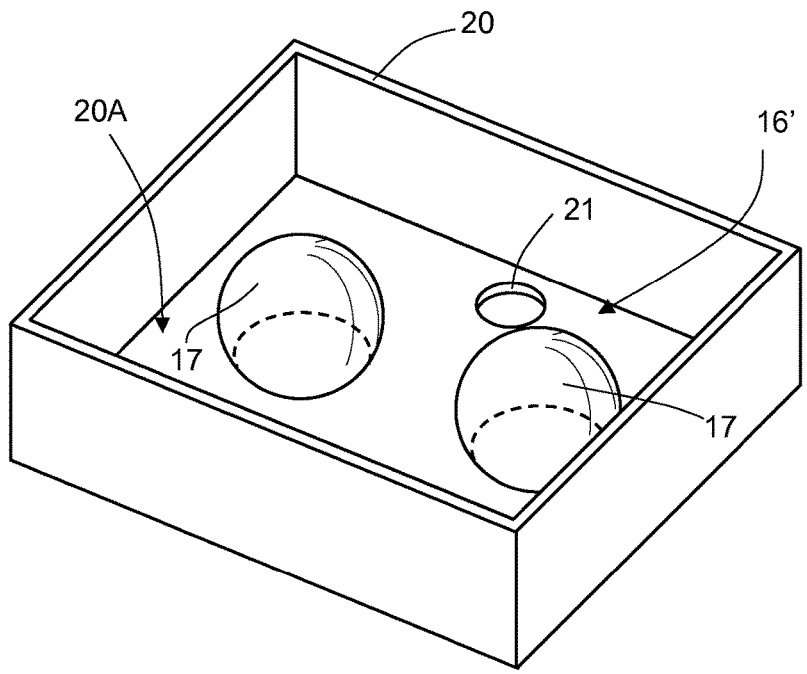
FIG. 16 is a perspective view from the bottom of the cap of a different embodiment.
Figure 17:
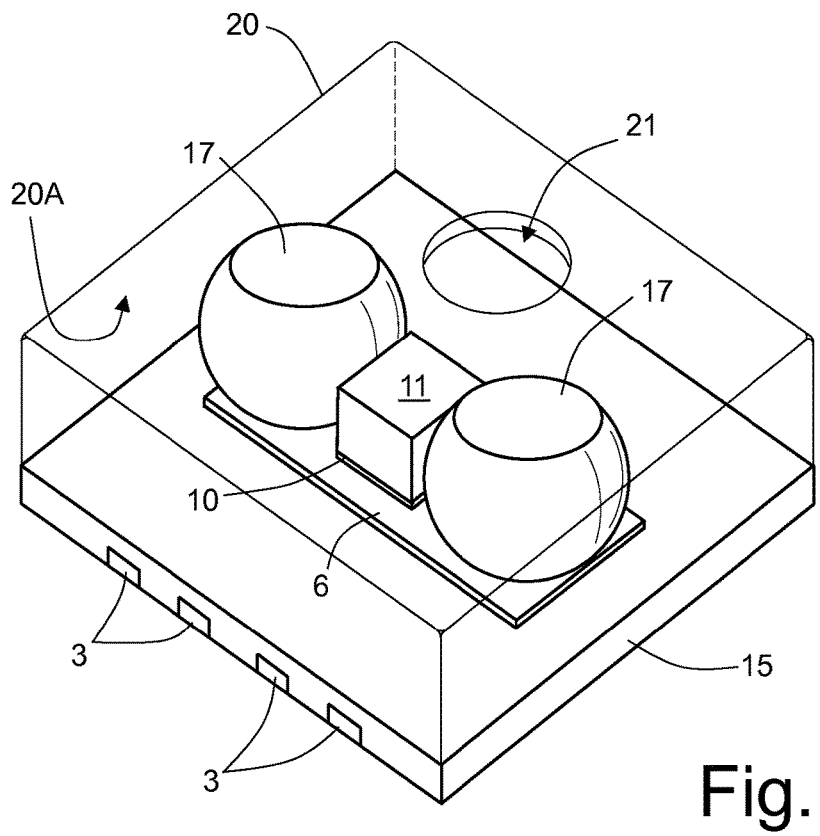
FIG. 17 is a perspective top view of a packaged device having the cap of FIG. 16.

For example, the damping structure 16 may have a different shape and/or be formed in a different position. FIGS. 16 and 17 show an embodiment of a damping structure 16', where the bumps 17 are attached to an interior face 20A of the cap 20, in a position intended to face the first die 6 after mounting the cap 20 to the base region 15 (as shown in FIG. 17). As an alternative, the bumps 17 may be arranged so as to face the base region 15, laterally to the bonding wires 14, so as not to damage them when the base region 15 deforms or bends during fall or drop. In some embodiments, the bumps 17 may be also be formed on the second die 11, on the die surface far from the sensing membrane area (diaphragm 12), after wire bonding, in case partially embedding the wire connections to the die.

In any case, the bumps 17 have a height such that their distance from the cap 20 (if formed on the first die 6 or the base region 15) or from a facing surface (the first die 6 or the base region 15, if formed on the cap 20) is lower than the distance of the bonding wires 14 from the cap 20, to protect them in case of device drop.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A surface mounting device comprising:
a body of semiconductor material;
a package delimiting an open cavity, the body located in the open cavity, the package including a base region layer supporting the body, a cap, and contact terminals, the base region layer having a surface that forms an outer surface of the package, wherein the base region has a Young's modulus less than 5 MPa and is configured to flex into the open cavity of the package; and
a damping structure located in the open cavity between the cap and the base region, the damping structure occupying a first portion of the open cavity, a second portion of the cavity remaining open, the damping structure being configured to limit movement of the body toward the cap.

2. The device according to claim 1, wherein the base region is an elastic material or an elastomeric material having a Young's modulus less than 2 MPa.

3. The device according to claim 1, wherein the base region has a cavity underlying the body and an internal annular portion attached to a peripheral lower portion of the body.

4. The device according to claim 1, further comprising bonding wires having first ends coupled to bond pads of the body and second ends coupled to the contact terminals, the base region covering the second ends of the bonding wires and partially surrounding the contact terminals.

5. The device according to claim 1, wherein the cap is directly fixed to the base region.

6. The device according to claim 1, wherein the damping structure comprises bumps of an elastic material.

7. The device according to claim 1, wherein the body comprises an integrated circuit die and a MEMS die mounted on the integrated circuit die.

8. The device according to claim 7, wherein a die attach film is between the MEMS die and the integrated circuit die.

9. The device according to claim 7, further comprising:
bonding wires electrically coupling the MEMS die to the contact terminals; and
bumps of an elastic material beside the MEMS die and having a height configured to prevent the bonding wires from hitting the cap when the device is exposed to a force above a threshold.

10. A process comprising:
attaching a body of semiconductor material to a rigid supporting frame, the supporting frame including contact terminals separated by cavities;
molding an elastic material having a Young's modulus less than 5 MPa to form a base region that at least partially covers lateral sides of the body and fills the cavities of the supporting frame;
forming a damping structure on the rigid supporting frame proximate the body;
fixing a cap to the base region to form a package surrounding the body, wherein fixing the cap forms an open cavity, the body and the damping structure being located in the open cavity and only filling a portion of the open cavity, the damping structure being configured to limit movement of the body toward the cap; and
removing the supporting frame to expose a surface of the base region,
wherein the elastic material is configured to flex into the open cavity in response to a force being applied to a portion thereof.

11. The process according to claim 10, comprising, before molding, electrically coupling the body to the contact terminals using bonding wires having ends attached to the contact terminals, wherein molding comprises covering the ends of the bonding wires by the base region.

12. The process according to claim 10, wherein forming the damping structure comprises dispensing elastic bumps on the body or on an inner surface of the cap prior to fixing the cap to the base region.

13. The process according to claim 10, wherein removing the die pad forms a cavity in the base region underlying the body and exposing a back portion of the body.

14. The process according to claim 10, wherein molding the base region comprises dispensing and curing the elastic material.

15. The process according to claim 10, wherein attaching the body to the die pad of the supporting frame comprises applying a first adhesive film between the body and the supporting frame.

16. The process according to claim 15, further comprising, after attaching the body to the die pad of the supporting frame and before molding an elastic material, attaching a MEMS component onto the body through a second adhesive film.

17. The process according to claim 16, wherein the first and second adhesive films are die attach films.

18. A semiconductor package comprising:
a package body having an open cavity;
a semiconductor die integrating an electrical component, the semiconductor die located in the open cavity;
conductive terminals;
conductive wires having first ends coupled to the semiconductor die and second ends coupled to the conductive terminals;
an elastic or elastomeric material covering the conductive terminals and the second ends of the conductive wires without covering the first ends of the conductive wires, the elastic or elastomeric material having a Young's modulus less than 5 MPa, a cap having ends coupled to the elastic or elastomeric material, the cap delimiting the open cavity, the first ends of the conductive wires being located in the open cavity; and at least one elastic bump located in the open cavity between the cap and the elastic or elastomeric material, wherein in response to a force being applied to an outer surface of the elastic or elastomeric material, the elastic or elastomeric material is configured to flex into the open cavity.

19. The semiconductor package according to claim 18, wherein the elastic or elastomeric material covers a portion of side surfaces of the semiconductor die and has a Young's modulus less than 2 MPa.

20. The semiconductor package according to claim 18, wherein the elastic bump being configured to flex in response to hitting a surface of the cap thereby limiting movement of the semiconductor device towards the cap.

21. The semiconductor package according to claim 18, further comprising a die pad, the semiconductor die being coupled to the die pad, the elastic or elastomeric material covering side surfaces of the die pad.

22. The semiconductor package according to claim 18, comprising a recess in the elastic or elastomeric material below at least a portion of the semiconductor die.

23. The device according to claim 1, the body including a perimeter portion and a center portion, the base region supporting the body at the perimeter without supporting the center portion of the body.

* * * * *